US008866443B2

(12) United States Patent
Abe et al.

(10) Patent No.: US 8,866,443 B2
(45) Date of Patent: Oct. 21, 2014

(54) LEAD ACID STORAGE BATTERY AND LEAD ACID STORAGE BATTERY SYSTEM FOR NATURAL ENERGY UTILIZATION SYSTEM

(75) Inventors: Keiko Abe, Mito (JP); Yasuhiro Kobayashi, Hitachinaka (JP); Masahiro Watanabe, Hitachi (JP); Hisaaki Takabayashi, Nabari (JP); Yoshikazu Hirose, Matsudo (JP); Shinichi Sano, Nabari (JP); Ichiro Shimoura, Iga (JP)

(73) Assignee: Shin-Kobe Electric Machinery Co., Ltd., Tokyo (JP)

( * ) Notice: Subject to any disclaimer, the term of this patent is extended or adjusted under 35 U.S.C. 154(b) by 232 days.

(21) Appl. No.: 13/059,253

(22) PCT Filed: Jan. 17, 2011

(86) PCT No.: PCT/JP2011/050625
§ 371 (c)(1),
(2), (4) Date: Sep. 14, 2011

(87) PCT Pub. No.: WO2012/020575
PCT Pub. Date: Feb. 16, 2012

(65) Prior Publication Data
US 2012/0038312 A1      Feb. 16, 2012

(30) Foreign Application Priority Data

Aug. 11, 2010   (JP) ................................ 2010-179912

(51) Int. Cl.
*H02J 7/00* (2006.01)
*H02J 7/14* (2006.01)
*G01R 31/36* (2006.01)
*H01M 10/44* (2006.01)

(52) U.S. Cl.
CPC ........ *G01R 31/3651* (2013.01); *G01R 31/3679* (2013.01); *G01R 31/3624* (2013.01)

USPC .............. 320/132; 320/101; 320/123; 702/63

(58) Field of Classification Search
USPC .......... 320/101, 116, 123, 132; 324/427, 432; 702/63
See application file for complete search history.

(56) References Cited

U.S. PATENT DOCUMENTS 5,905,360 A * 5/1999 Ukita ............................ 320/118
7,564,221 B2 * 7/2009 Asai et al. .................... 320/132
(Continued)

FOREIGN PATENT DOCUMENTS

EP    1 160 953     12/2001
EP    1 257 033     11/2002
(Continued)

OTHER PUBLICATIONS

International Search Report in PCT/JP2011/050625 (in Japanese), dated Apr. 27, 2011 (5 pgs.).
(Continued)

*Primary Examiner* — Richard V Muralidar
*Assistant Examiner* — David Henze-Gongola
(74) *Attorney, Agent, or Firm* — Antonelli, Terry, Stout & Kraus, LLP.

(57) ABSTRACT

The life of a lead acid storage battery is extended by changing an over-frequency equalized charge interval performed on a lead acid storage battery, in accordance with a transition situation of a state of charge (SOC) of the lead acid storage battery. The lead acid storage battery is also made to be advantageous in terms of cost by reducing the equalized charge with a low degree of urgency to reduce the power and cost for equalized charge, and by reducing the number of stops of a natural energy storage system. A lead acid storage battery and a lead acid storage battery system whose operational management can be easily performed are achieved by a method in which the future timing when the equalized charge is performed can be grasped by people operating the lead acid storage battery.

18 Claims, 14 Drawing Sheets

(56) References Cited

U.S. PATENT DOCUMENTS

| | | | |
|---|---|---|---|
| 8,253,378 B2* | 8/2012 | Lee et al. | 320/118 |
| 8,427,105 B2* | 4/2013 | Plett | 320/116 |
| 8,493,031 B2* | 7/2013 | Murao et al. | 320/132 |
| 8,508,191 B2* | 8/2013 | Kim et al. | 320/121 |
| 8,548,762 B2* | 10/2013 | Prada et al. | 702/63 |
| 2010/0085009 A1* | 4/2010 | Kang et al. | 320/118 |
| 2010/0259210 A1* | 10/2010 | Sasaki et al. | 320/101 |
| 2011/0057617 A1* | 3/2011 | Finberg et al. | 320/118 |
| 2012/0053837 A1* | 3/2012 | Viassolo et al. | 702/1 |
| 2012/0101674 A1* | 4/2012 | Wang et al. | 701/22 |
| 2012/0187913 A1* | 7/2012 | Abe et al. | 320/134 |
| 2012/0274331 A1* | 11/2012 | Liu et al. | 324/426 |

FOREIGN PATENT DOCUMENTS

| | | |
|---|---|---|
| JP | 2003-288947 | 10/2003 |
| JP | 2004-039434 | 2/2004 |
| JP | 2004-186087 | 7/2004 |
| WO | WO 2010/079745 | 7/2010 |
| WO | WO 2011052314 A1 * | 5/2011 |

OTHER PUBLICATIONS

Official Action issued in European Patent Application No. 11702780.5 on Apr. 4, 2014.

* cited by examiner

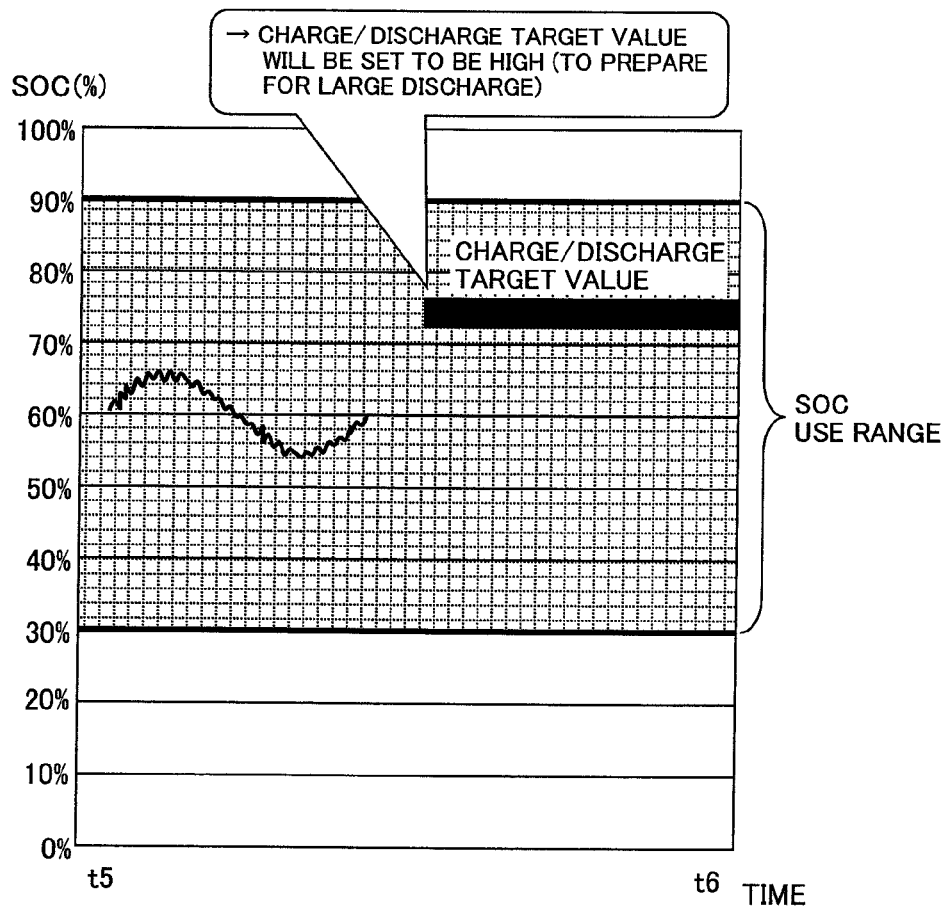

LEAD ACID STORAGE BATTERY AND LEAD ACID STORAGE BATTERY SYSTEM FOR NATURAL ENERGY UTILIZATION SYSTEM

TECHNICAL FIELD

The present invention relates to a lead acid storage batttery and a lead acid storage batttery system that are used in a natural energy utilization system, such as a wind power generation system, and in particular, to a lead acid storage battery and a lead acid storage batttery system that are used in a natural energy utilization system in which the life of the lead acid storage batttery can be extended and the cost of equalized charge and the loss involving stops of a wind power generation storage system can be reduced by grasping the SOC (State of Charge) transition of the lead acid storage batttery used for suppressing the fluctuation in the wind power generation such that the equalized charge of the lead acid storage batttery is performed at a proper frequency and in a proper method in accordance with the SOC transition situation.

BACKGROUND ART

Global warming is a serious problem for all humankind, and in order to delay and stop the progress of the warming, every country is trying to promote energy saving by building efficient power systems or smart grids, and promote large-scale introduction of natural energies that do not discharge carbon dioxide, such as photovoltaic power generation and wind power generation, etc.

For example, the wind power generation has the merit of not discharging carbon dioxide by utilizing natural energy that circulates in the atmosphere; however, there is the concern that the power system may be adversely affected or the quality of power may be deteriorated because the output of the power generation is dependent on wind conditions and accordingly unstable. In order to prevent such an adverse influence on the power system and utilize the energy effectively, it is expected that a wind power generation storage system is achieved in which energy fluctuations are equalized such that the output of the power generation is stabilized by using a lead acid storage batttery, etc. The lead acid storage batttery used for suppressing the fluctuation in the output of the wind power generation is required to have the same long life as a wind power generator and be installed at a low cost.

The lead acid storage batttery for suppressing the fluctuation in the output of the wind power generation is operated in a PSOC (Partial State of Charge) such that charge/discharge can be performed in accordance with the fluctuation in the output of the wind power generation. Accordingly, the lead acid storage batttery is not fully charged in a normal operation state, different from the conventional lead acid storage battery for emergency that is fully charged normally and discharged when needed and industrial lead acid storage batttery that is fully charged at night and discharged when a load is large in the daytime. In order to prevent the degradation of the negative electrode due to sulfation occurring in a low SOC in the particular application, equalized charge (recovery charge) is regularly (usually once every one or two weeks) performed in which the lead acid storage batttery is fully charged. Another purpose of the equalized charge is, for accurately grasping an SOC, to regularly reset an SOC value such that the value is made to be 100% after the equalized charge.

However, there has been a problem that, if the equalized charge is performed too often, degradation of the positive electrode conversely occurs due to the overcharge, and thereby the life of the lead acid storage batttery is shortened, etc. Patent document 1 discloses the case where equalized charge intervals of a lead acid storage batttery are changed in accordance with ambient temperature. Patent document 2 discloses that the degradation of the positive electrode is prevented by setting the amount of the overcharge at the equalized charge of a lead acid storage batttery to a lower value (99% to 102%) than the conventional one (110% to 115%).

PRIOR ART DOCUMENTS

Patent Documents

[Patent document 1] Japanese Unexamined Patent Publication No. 2003-288947

[Patent document 2] Japanese Unexamined Patent Publication No. 2004-39434

SUMMARY OF INVENTION

Problems to be Solved by the Invention

An object of the present invention is to provide, in lead acid batteries or lead acid storage batttery systems that are used in natural energy utilization systems, a new lead acid storage batttery and a new lead acid storage batttery system in which the life of the lead acid storage batttery can be extended by changing an equalized charge interval performed on the lead acid storage batttery in accordance with a status of use (SOC transition) of the lead acid storage batttery, and the lead acid storage batttery is also made to be advantageous in terms of cost by reducing the equalized charge only for grasping an SOC to reduce the power and cost for equalized charge, and by reducing the number of stops of a natural energy storage system.

Another object of the present invention is to provide a lead acid storage batttery and a lead acid storage batttery system whose operations can be easily managed by making a timing when the next equalized charge is scheduled to be performed understandable for those who operate the lead acid storage batttery.

Means for Solving the Problems

The present invention relates to a lead acid storage batttery or lead acid storage batttery system to be used in a natural energy utilization system, including: a storage batttery state measurement unit for measuring a state of the lead acid storage batttery; an SOC model representing the relationship between output factors of the lead acid storage batttery including current, voltage, and temperature thereof, and a state of charge of the lead acid storage batttery; and an equalized charge performance unit for performing equalized charge of the lead acid storage batttery. The lead acid storage batttery or lead acid storage batttery system comprises: an SOC estimation unit configured to estimate a state of charge of the lead acid storage batttery from the information measured by the storage batttery state measurement unit and the information from the SOC model; an SOC transition DB configure to record how a state of charge of the lead acid storage batttery makes a transition; an SOC transition history management unit configured to record, in the SOC transition DB, a value of state of charge estimated by the SOC estimation unit and to check an SOC transition situation; a degradation model representing the relationship between an operation situation of the lead acid storage batttery including a state of charge of the lead acid storage batttery and degradation;

and an equalized charge optimal planning unit configured to plan an optimal method of performing the equalized charge based on the information on the SOC transition situation from the SOC transition history management unit and the information from the degradation model.

Also, in the lead acid storage batttery or lead acid storage batttery system to be used in a natural energy utilization system, the equalized charge optimal planning unit further has an equalized charge interval determination unit and an equalized charge method determination unit.

Also, in the lead acid storage batttery or lead acid storage batttery system to be used in a natural energy utilization system, the SOC model has an SOC model at discharge, an SOC model at charge, and an SOC estimation model selection unit configured to select one of the SOC model at discharge and the SOC model at charge based on the information from the storage batttery state measurement unit.

Also, the lead acid storage batttery or lead acid storage batttery system to be used in a natural energy utilization system further has a temporary SOC estimation result DB and an SOC model reliability DB, and the SOC estimation unit estimates a temporary SOC, which is an SOC of the lead acid storage batttery, by using the selected one of the SOC model at discharge and the SOC model at charge, and divides the estimated temporary SOC into an estimation result at discharge and an estimation result at charge to store in the temporary SOC estimation result DB, and the SOC estimation unit estimates a current SOC based on the estimation result at discharge, the estimation result at charge, and the information from the SOC model reliability DB.

Also, in the lead acid storage batttery or lead acid storage batttery system to be used in a natural energy utilization system, an "equalized charge interval" determined by the equalized charge optimal planning unit is based on any one of a discharge amount (Ah), a charge/discharge amount (Ah), a discharge period of time, and discharge days of the lead acid storage batttery. Also, the lead acid storage batttery or lead acid storage batttery system to be used in a natural energy utilization system further comprise an SOC transition information-equalized charge information output unit configured to output outside the information on the SOC transition situation stored in the SOC transition DB and the information on a performance schedule of the equalized charge determined by the equalized charge optimal planning unit.

Also, the lead acid storage batttery or lead acid storage batttery system to be used in a natural energy utilization system includes an SOC transition information-equalized charge information output unit configured to output outside the information on an SOC transition situation stored in the SOC transition DB and the information on a performance schedule of the equalized charge determined by the equalized charge optimal planning unit.

Also, in the lead acid storage batttery or lead acid storage batttery system to be used in a natural energy utilization system, the SOC transition information-equalized charge information output unit outputs the information on a discharge amount (Ah) or a charge/discharge amount (Ah) of the lead acid storage batttery, besides the information on the SOC transition situation and the information on the performance schedule of the equalized charge.

A lead acid storage batttery or lead acid storage batttery system to be used in a natural energy utilization system, including: a storage batttery state measurement unit for measuring a state of the lead acid storage batttery; an SOC model representing the relationship between output factors including current, voltage, and temperature of the lead acid storage batttery and a state of charge of the lead acid storage batttery; and a charge/discharge performance unit for performing equalized charge of the lead acid storage batttery, includes: an SOC estimation unit configured to estimate a state of charge of the lead acid storage batttery from the information measured by the storage batttery state measurement unit and the information from the SOC model; an SOC transition DB configured to record an SOC transition situation of the lead acid storage batttery; an SOC transition history management unit configured to record, in the SOC transition DB, a value of SOC estimated by the SOC estimation unit and to check an SOC transition situation; a wind power generation prediction DB created by analyzing the wind power generation information in the past to obtain a predictive value of the wind power generation; a wind power generation prediction unit configured to predict a wind power generation amount in the future by using the wind power generation prediction DB; a degradation model representing the relationship between an operation situation of the lead acid storage batttery including an SOC thereof and charge/discharge of the storage batttery, and degradation; a charge/discharge planning unit configured to plan charge/discharge of the lead acid storage batttery optimal for the extension of the life of the lead acid storage batttery, based on the information on the prediction result of the wind power generation in the future from the wind power generation prediction unit, the information on the SOC estimation situation from the SOC transition history management unit, and the information from the degradation model; and a charge/discharge performance unit configured to control charge/discharge of lead acid storage batttery in accordance with the charge/discharge plan determined by the charge/discharge planning unit.

Also, the lead acid storage batttery or lead acid storage batttery system to be used in a natural energy utilization system includes a wind power generation information-SOC transition information-charge/discharge information output unit configured to output outside the information on the prediction result of the wind power generation by the wind power generation prediction unit, the information on the SOC transition situation stored in the SOC transition DB, and the information on the charge/discharge determined by the charge/discharge planning unit.

Effects of the Invention

According to the present invention, in a lead acid storage batttery or lead acid storage batttery system to be used in a natural energy utilization system, the life of the lead acid storage batttery can be extended by optimizing the frequency at which the equalized charge is performed and the charge method in terms of the SOC transition situation, life, and degradation, with: an SOC estimation unit configured to estimate a state of charge from the information from a storage batttery state measurement unit and the information from an SOC model; an SOC transition DB configured to record a state of charge transition of the lead acid storage batttery; an SOC transition history management unit configured to record, in the SOC transition DB, an estimated value of state of charge and to check an SOC transition situation; a degradation model; and an equalized charge optimal planning unit configured to plan an optimal method of performing the equalized charge based on the information on the SOC transition situation from the SOC transition history management unit and the information from the degradation model, being provided.

BRIEF DESCRIPTION OF THE DRAWINGS

FIG. 16A is an illustrative diagram of target setting of charge/discharge according to the third embodiment of the invention.

FIG. 16B is an illustrative diagram of target setting of the charge/discharge according to the third embodiment of the invention.

DESCRIPTION OF EMBODIMENTS

Hereinafter, preferred embodiments of the present invention will be described in detail with reference to the accompanying drawings.

First Embodiment

[System Configuration]

Figure 1:
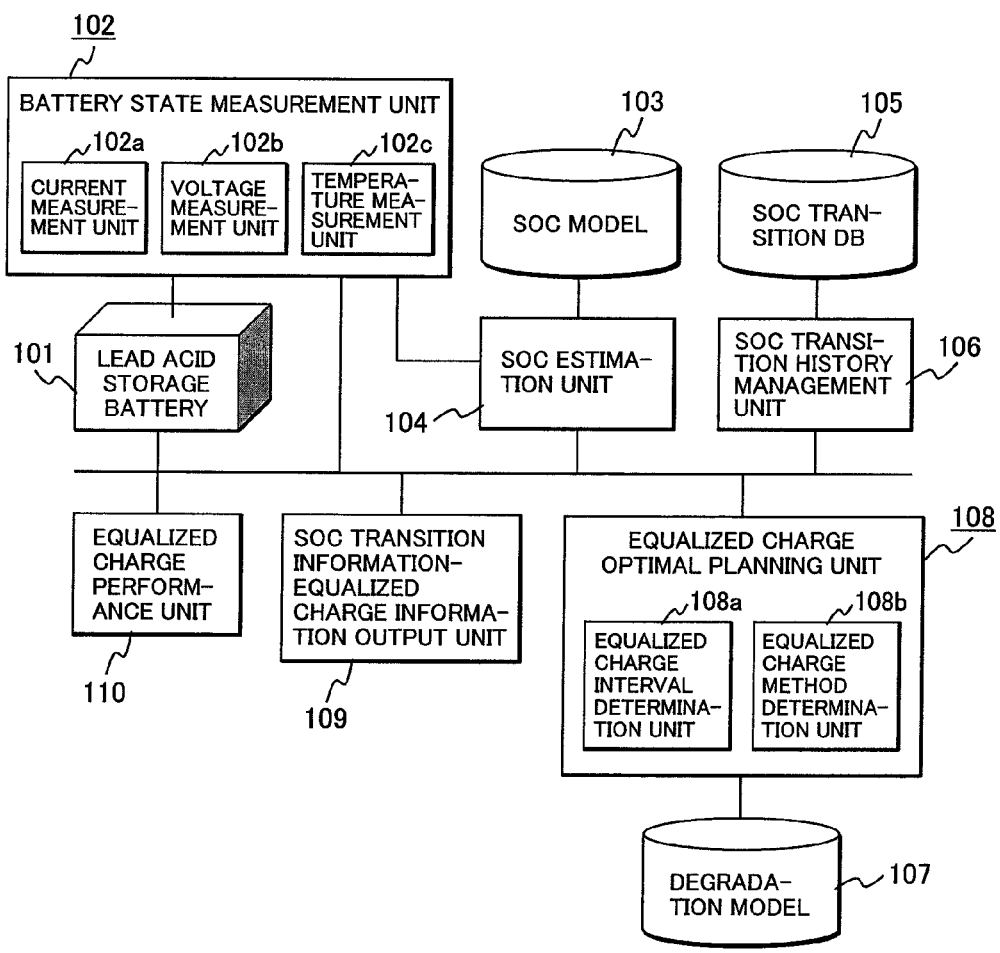
FIG. 1 is a functional block diagram of a first embodiment according to the present invention.

FIG. 1 illustrates a functional block diagram of a lead acid storage batttery and a lead acid storage batttery system according to a first embodiment of the present invention, which are to be applied to a natural energy utilization system. The lead acid storage batttery system of the invention is composed of a lead acid storage batttery 101, a storage batttery state measurement unit 102, an SOC model 103, an SOC estimation unit 104, an SOC transition DB 105, an SOC transition history management unit 106, a degradation model 107, an equalized charge optimal planning unit 108, an SOC transition information-equalized charge information output unit 109, and an equalized charge control unit 110.

The function of each of the aforementioned components will be described. The storage batttery state measurement unit 102 has a current measurement unit 102a, a voltage measurement unit 102b, and a temperature measurement unit 102c such that a state of the lead acid storage batttery, such as current (A), voltage (V), and temperature (° C.), etc., of the lead acid storage batttery 101, is measured.

The SOC model 103 is a model representing the relationship between current, voltage, and temperature, etc., of the lead acid storage batttery, and a storage batttery SOC thereof, and is created in advance by checking the characteristics of the lead acid storage batttery.

A method of creating an SOC model is described, as an example, in detail in "MODELING METHOD FOR LEAD ACID STORAGE BATTTERY SIMULATION USING STEP CHANGING CURRENT" (Publication of Power and Energy Society B, Vol. 128 No. 8, 2008), which also includes a procedure of creating a model.

Figure 2:
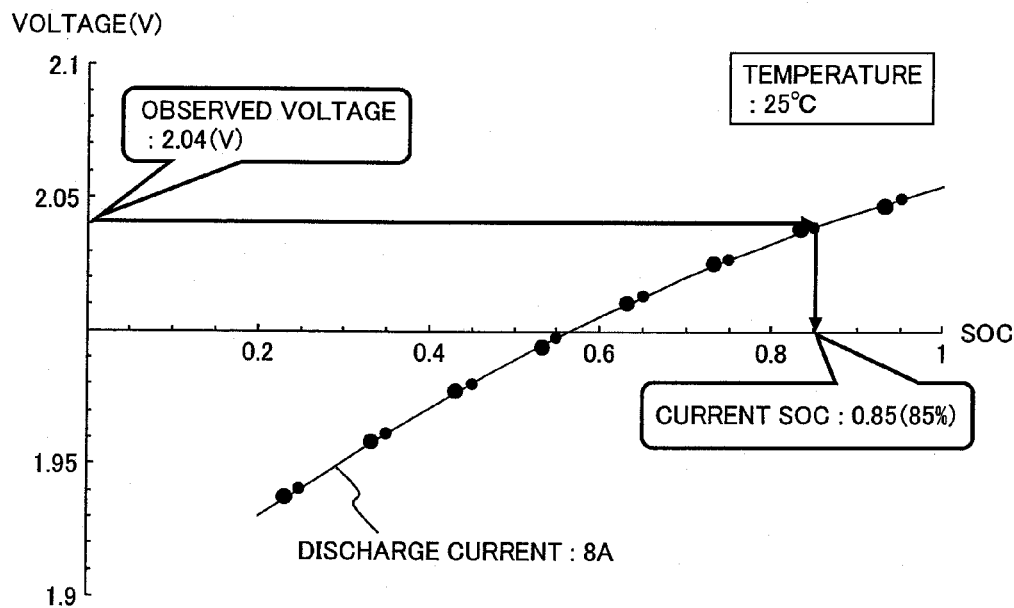
FIG. 2 is a graph illustrating SOC estimation using an SOC model according to the first embodiment of the invention.

The SOC estimation unit 104 estimates an SOC of the lead acid storage batttery from the information measured by the storage batttery state measurement unit 102 and the information from the SOC model 103. FIG. 2 illustrates an example in which an SOC is estimated by using the SOC model (discharge model) representing the relationship between current, voltage, and temperature of the lead acid storage batttery and a storage batttery SOC thereof.

A method of estimating an SOC of a lead acid storage batttery using an SOC model is described in detail in Japanese Patent Application No. 2009-225996, which is a prior application of the present application.

The SOC transition DB 105 is a database for recording how an SOC of the lead acid storage batttery makes a transition. The SOC estimation unit 104 records and adds the information on an SOC estimation result in the SOC transition DB 105. An SOC estimation result is recorded or updated when needed in a method, or SOC estimation results are recorded every certain period of time in another method.

The SOC transition history management unit 106 records, in the SOC transition DB 105, the SOC value estimated by the SOC estimation unit 104 and extracts the information on the SOC transition situation in the past from the SOC transition DB 105. For example, the SOC transition history management unit 106 extracts and provides the data on the SOC transition situation for an immediately preceding certain period of time, according to the demand of the equalized charge optimal planning unit 108.

The degradation model 107 includes the relationship between an operation situation of the storage batttery including an SOC thereof and degradation, and the information indicating an SOC and an optimal interval and method, etc., of the equalized charge corresponding to the SOC. The degradation model 107 is created in advance by checking the relationship between an operation of the lead acid storage batttery and the life and degradation thereof.

A method of creating a model representing the relationship between an operation situation of a storage batttery including an SOC of a lead acid storage batttery and degradation is described in detail in Japanese Patent Application No. 2009-001345, which is a prior application of the present appreciation.

The equalized charge optimal planning unit 108 has an equalized charge interval determination unit 108a and an equalized charge method determination unit 108b that are configured to acquire an SOC transition situation from the SOC transition history management unit 106 and determine an optimal equalized charge interval and method of the lead acid storage batttery in accordance with each SOC transition situation such that the degradation is prevented and the life of the lead acid storage batttery is extended. With the aforementioned configuration, the equalized charge optimal planning unit 108 determines an optimal method of performing the equalized charge, in which the predicted life of the lead acid storage batttery is made longest, by using the information from the degradation model 107.

The SOC transition information-equalized charge information output unit 109 outputs outside the information on the SOC transition situation stored in the SOC transition DB 105 and the information on the performance schedule of the equalized charge determined by the equalized charge optimal planning unit 108.

The equalized charge control unit 110 performs the equalized charge (recovery charge) on the lead acid storage batttery 101 in accordance with the plan determined by the equalized charge optimal planning unit 108.

[Method of Estimating SOC]

Figure 3:
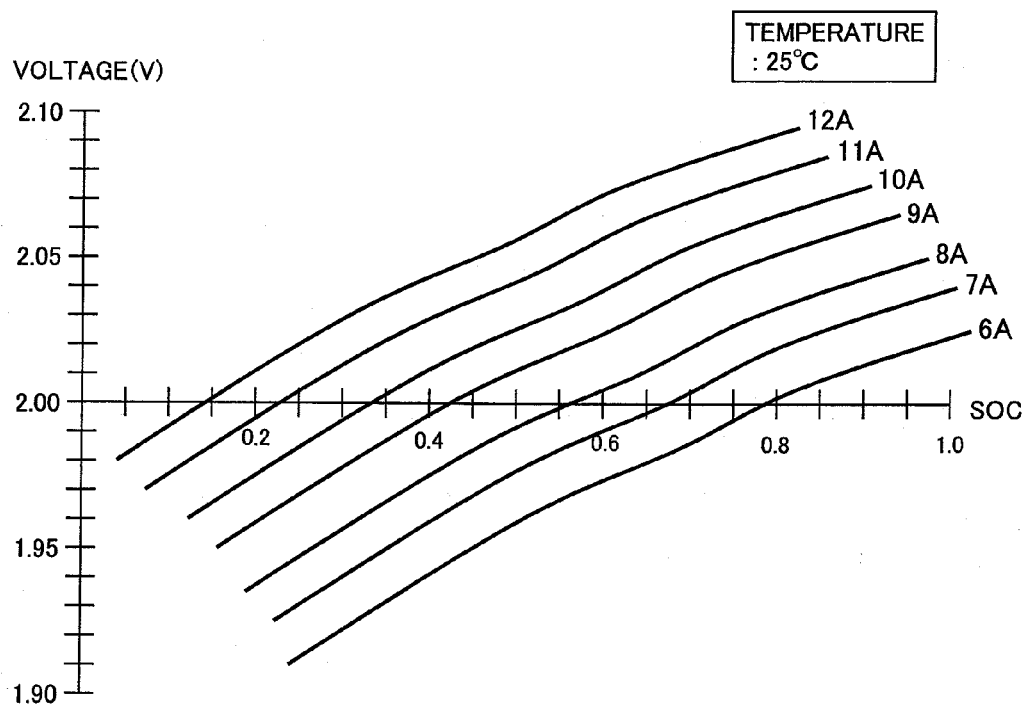
FIG. 3 is a graph illustrating the SOC model (discharge characteristics model) according to the first embodiment of the invention.

Subsequently, an SOC model and estimation of an SOC using the SOC model will be described with reference to FIGS. 2 and 3. FIGS. 2 and 3 illustrate examples of an SOC model (discharge model) representing the relationship between current, voltage, and temperature of the lead acid storage batttery, and a storage batttery SOC thereof.

Figure 7:
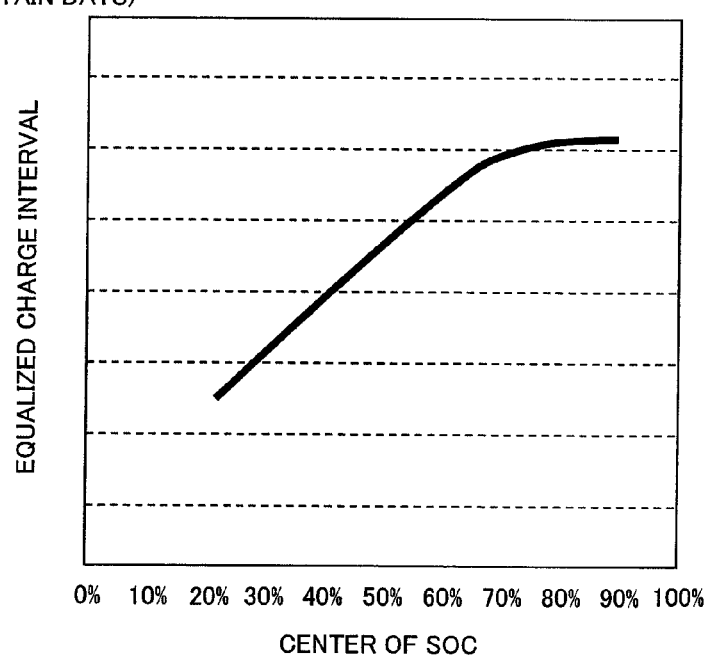
FIG. 7 is a graph illustrating a degradation model.

The curve in FIG. 2 illustrates an example (temperature: 25° C., discharge current: 8 A) of an SOC model representing the relationship between the current, voltage, and temperature of the lead acid storage batttery and a storage batttery SOC thereof. In the graph, the vertical axis represents a terminal voltage (V) and the horizontal axis represents an SOC. Accordingly, it is assumed that, when temperature is, for example, 25° C., current of 8 A is made to flow and a terminal voltage at the time is 2.04 (V). In this case, it can be estimated that an SOC of the lead acid storage batttery is 0.85 (85%) from the SOC model, as illustrated in FIG. 7.

FIG. 2 illustrates only one example where temperature is 25° C. and discharge current is 8 A; however, even if it is limited to a model where temperature is, for example, 25° C., there exist multiple characteristic curves for every current, as illustrated in FIG. 3. Further, there exists a model having such multiple curves for every temperature characteristic and degradation (it is desirable that characteristic curves are further prepared for every temperature characteristic and every degradation).

An SOC model and a method of estimating an SOC using the SOC model (FIGS. 2 and 3) are described in detail in the previously described Japanese Patent Application 2009-225996. In addition, a method of creating an SOC model is described, as an example, in detail in "MODELING METHOD FOR LEAD ACID STORAGE BATTTERY SIMULATION USING STEP CHANGING CURRENT" (Publication of Power and Energy Society B, Vol. 128 No. 8, 2008), which also includes a procedure of creating a model.

[SOC Transition Situation]

Figure 4:
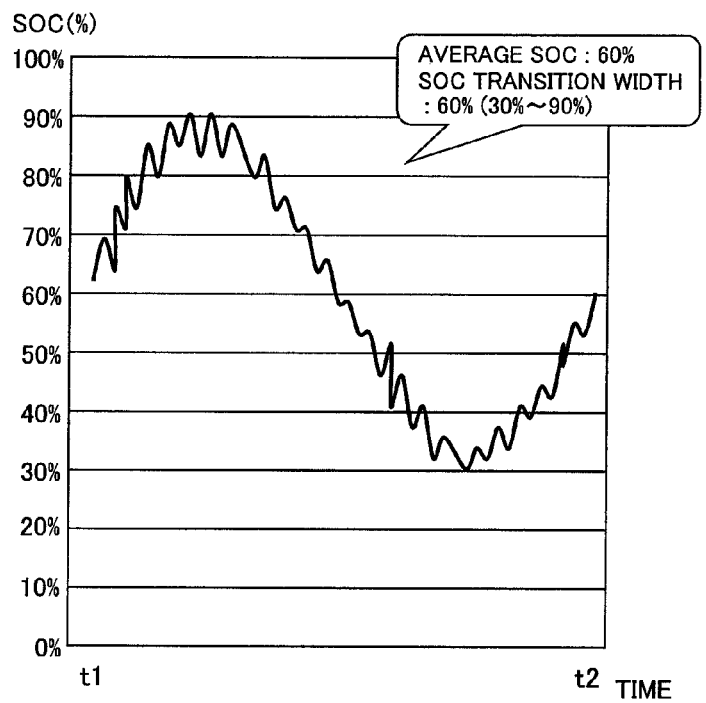
FIG. 4 is a graph illustrating the data in an SOC transition DB according to the first embodiment of the invention.
Figure 5:
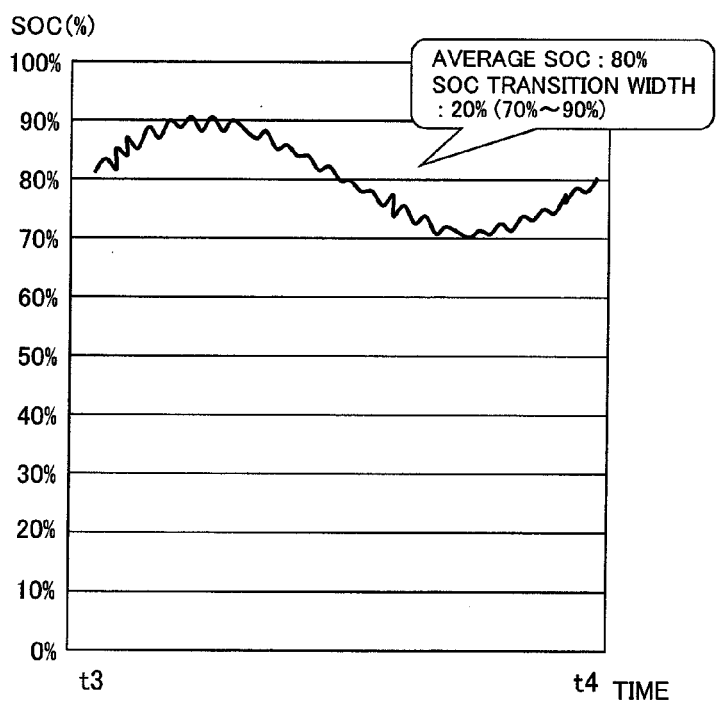
FIG. 5 is a graph illustrating the data in the SOC transition DB.
Figure 6:
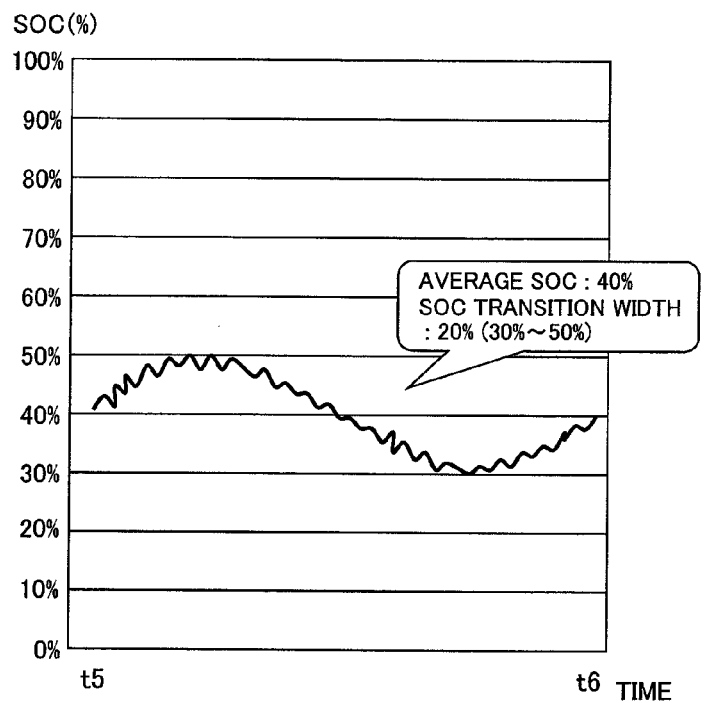
FIG. 6 is a graph illustrating the data in the SOC transition DB.

Subsequently, examples of an SOC transition situation stored in the SOC transition DB will be described with reference to FIGS. 4 to 6. The examples of the diagrams illustrate an SOC transition at each time, and an average SOC and a transition width for a certain period of time, etc. FIG. 4 illustrates the case where an average SOC is 60% and a transition width is between 30% and 90%. FIG. 5 illustrates the case where an average SOC is 80% and a transition width is between 70% and 90%. The SOC of FIG. 5 makes a transition in a range higher than that of FIG. 4 (a range where sulfation of the negative electrode hardly occurs). FIG. 6 illustrates the case where an average SOC is 40% and a transition width is between 30% and 50%, and accordingly the SOC of FIG. 6 conversely makes a transition in a range lower than that of FIG. 4 (a range where sulfation of the negative electrode is likely to occur).

[Degradation Model]

Figure 8:
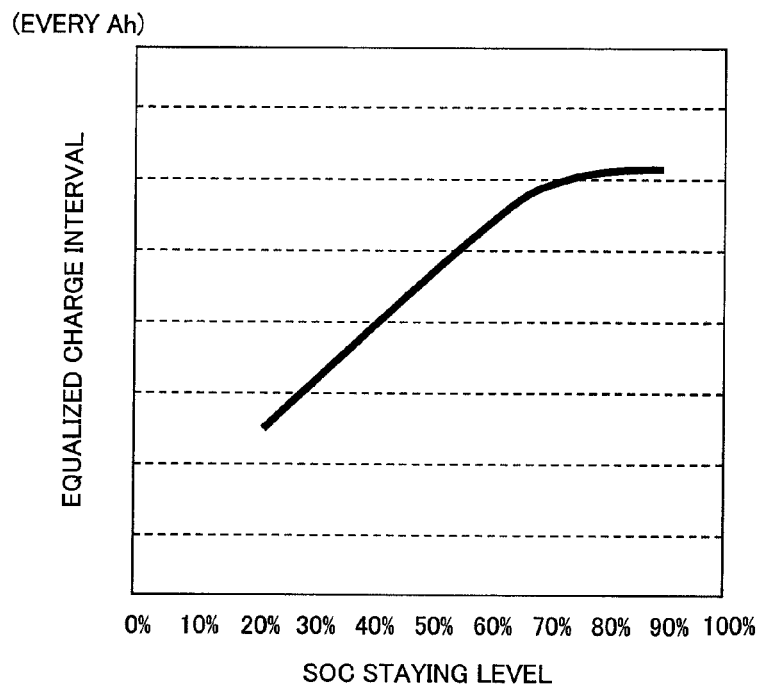
FIG. 8 is a graph illustrating a degradation model according to the first embodiment of the invention.
Figure 9:
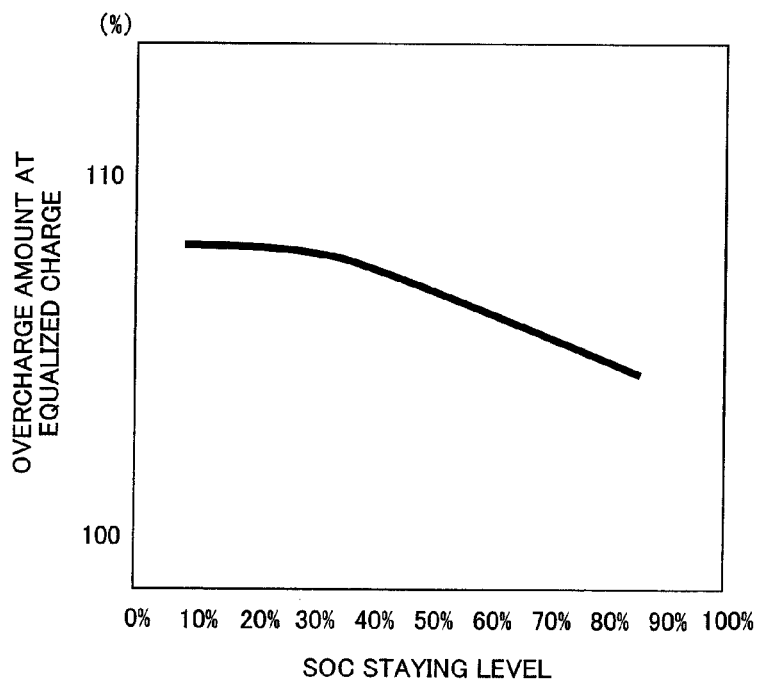
FIG. 9 is a graph illustrating a degradation model.

Subsequently, examples of the degradation model 107 of the lead acid storage batttery will be described with reference to FIGS. 7 to 9. The example of FIG. 7 represents the relationship between the center of an SOC transition and the equalized charge interval optimal for the center of an SOC transition, i.e., in which the life of the lead acid storage batttery can be made longest. The example of FIG. 8 represents the relationship between an SOC staying level and the equalized charge interval optimal for the SOC staying level, i.e., in which the life of the lead acid storage batttery can be made longest. Although an SOC staying level changes momentarily, it is also possible to determine an optimal equalized charge interval by, for example, weighing the SOC staying level in accordance with its staying period of time. It is also effective that an equalized charge interval is determined by "every certain days" as illustrated in FIG. 7, or by "after certain Ah-charge/discharge (after certain Ah-discharge)" as illustrated in FIG. 8. The example of FIG. 9 represents the relationship between an SOC staying level and an overcharge amount at equalized charge optimal for the SOC staying level.

Thus, the life of the lead acid storage batttery can be extended by optimizing a timing of the equalized charge (equalized charge interval), a method of the equalized charge, and an overcharge amount, etc., in accordance with an SOC transition situation. A method of creating a degradation model is also described in detail in the aforementioned Japanese Patent Application No. 2009-225996.

[System Processing Flow]

Figure 10:
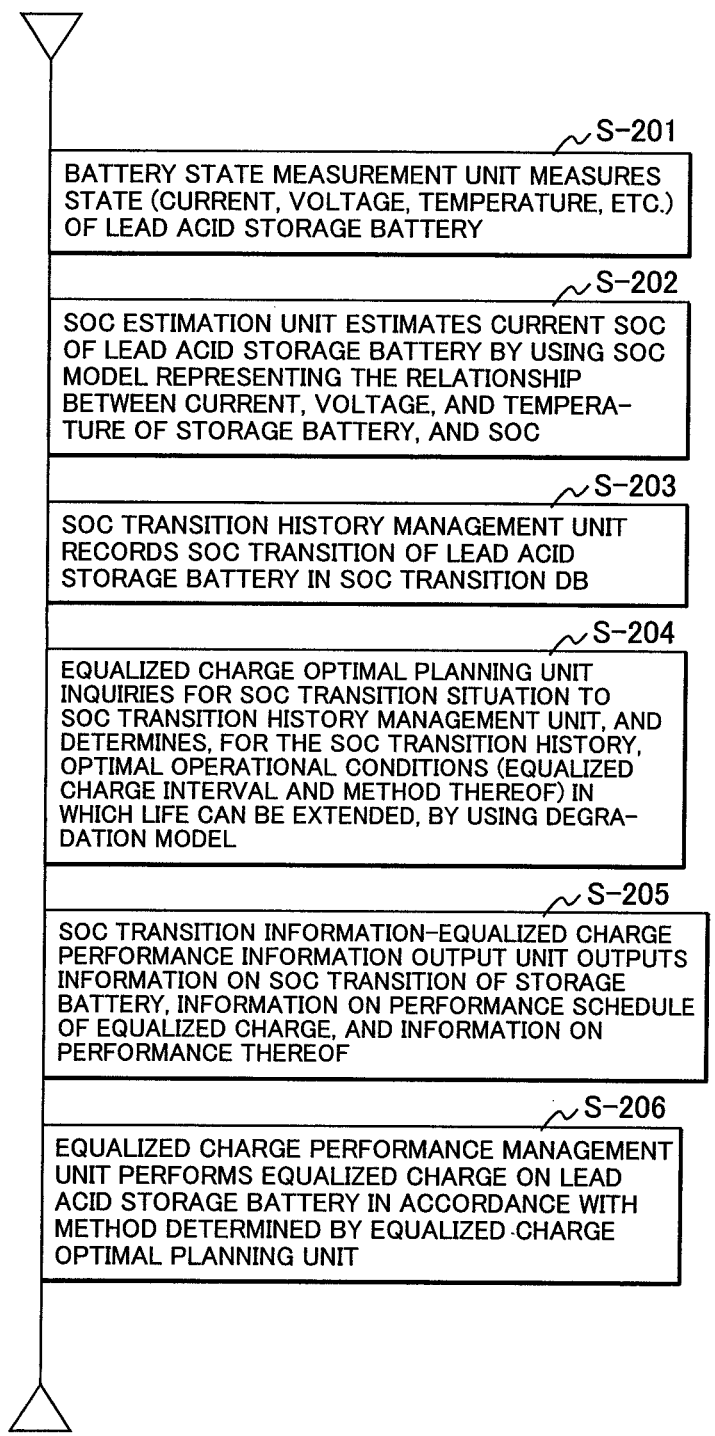
FIG. 10 is a processing flow diagram according to the first embodiment of the invention.

Subsequently, the processing flow according to the first embodiment will be described for each step with reference to FIG. 10. The storage batttery state measurement unit 102 first measures a state (current, voltage, temperature, etc.) of the lead acid storage batttery 101 (S201).

Subsequently, the SOC estimation unit 104 estimates a current SOC of the lead acid storage batttery by using the SOC model 103 representing the relationship between the current, voltage, and temperature of the lead acid storage batttery, and an SOC (S202). Then, the SOC transition history management unit 106 records an SOC transition of the lead acid storage battery 101 in the SOC transition DB 105 (S203).

The equalized charge optimal planning unit 108 inquiries for an SOC transition situation to the SOC transition history management unit 106, and the SOC transition history management unit 106 communicates an SOC transition situation to the equalized charge optimal planning unit 108 after referring to the SOC transition DB 105. The equalized charge optimal planning unit 108 determines, by using the degradation model 107 that is the information on operations of the lead acid storage batttery and degradation thereof, optimal operational conditions (equalized charge interval and equalized charge method) for the SOC transition history, in which the life of the lead acid storage batttery can be extended (S204).

The SOC transition information-equalized charge information output unit 109 outputs the information on an SOC transition of the lead acid storage batttery, the information on the performance schedule thereof, and the information on the performance thereof (S205). That is, the SOC transition information-equalized charge information output unit 109 outputs outside the information on the SOC transition situation stored in the SOC transition DB 105 and the information on the performance schedule of the equalized charge determined by the equalized charge optimal planning unit 108.

The equalized charge performance unit 110 performs equalized charge on the lead acid storage batttery in accordance with the method determined by the equalized charge optimal planning unit 108 (S206).

With the aforementioned processing, an optimal equalized charge can be performed in accordance with a status of use (SOC transition situation) of the lead acid storage batttery, in which the life of the lead acid storage batttery can be extended.

Figure 11A:
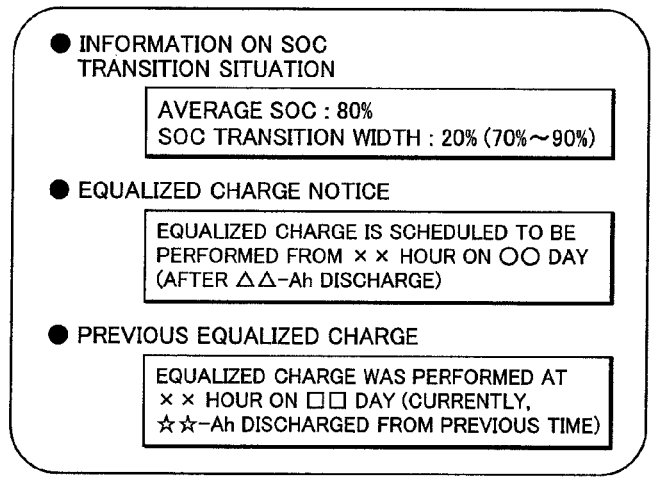
FIG. 11A is an illustrative diagram of an output of an SOC transition situation and an equalized charge notice according to the first embodiment of the invention.
Figure 11B:
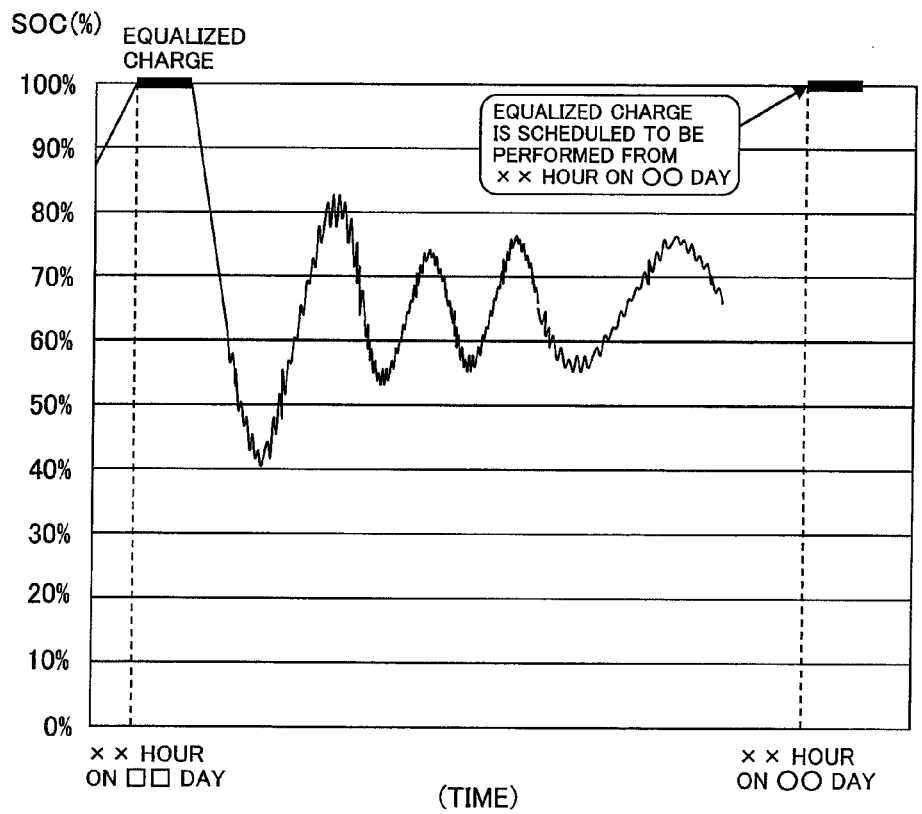
FIG. 11B is an illustrative diagram of an output of the SOC transition situation and the equalized charge notice according to the first embodiment of the invention.

FIGS. 11A and 11B illustrate output examples (displays) according to the first embodiment. An SOC transition situation and an equalized charge performance notice are displayed in the outputs. The portion with an SOC of 100% (or more) in the graph represents the time when the equalized charge is being performed. To achieve the extension of the life of the lead acid storage batttery, a timing of an equalized charge interval is changed in accordance with an SOC transition situation. As illustrated in FIGS. 11A and 11B, however, it becomes easy for users of the lead acid storage batttery to operate and control the lead acid storage batttery with an equalized charge performance timing, which can be predicted from the up-to-now SOC transition situations, being notified.

Second Embodiment

[System Configuration]

Figure 12:
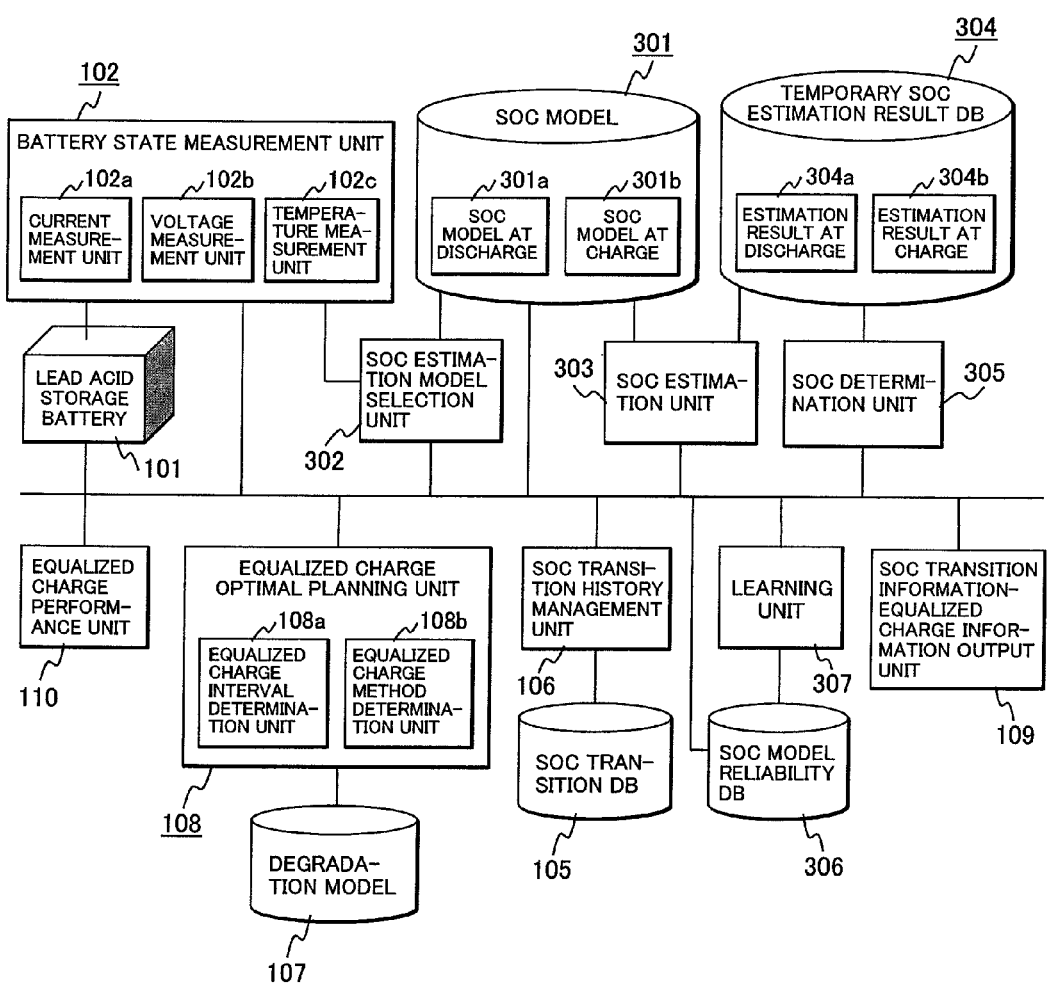
FIG. 12 is a functional block diagram of a second embodiment of the invention.

Subsequently, in a second embodiment of the present invention, a detailed functional block diagram, which is expected to be more accurate, will be illustrated in FIG. 12. The functional block according to the second embodiment is composed of a lead acid storage batttery 101, a storage batttery state measurement unit 102, an SOC model 301, an SOC estimation model selection unit 302, an SOC estimation unit 303, a temporary SOC estimation result DB 304, an SOC determination unit 305, an SOC model reliability DB 306, an SOC transition DB 105, an SOC transition history management unit 106, a degradation model 107, an equalized charge optimal planning unit 108, an SOC transition information-equalized charge information output unit 109, an equalized charge performance unit 110, and a learning unit 307.

Of every function according to the second embodiment, the portions different from those in FIG. 1 will only be described.

The SOC model 301 is a model representing the relationship between output factors of the lead acid storage batttery, such as current, voltage, and temperature, etc., and an SOC thereof. The SOC model 301 consists of: an SOC model at discharge 301a representing the relationship between output factors of the lead acid storage batttery at discharge, such as current, voltage, and temperature, etc., and an SOC thereof; and an SOC model at charge 301b representing the relationship between the current, voltage, and temperature, etc., of the lead acid storage batttery at charge, and an SOC thereof. Herein, the SOC model consisting of the SOC model at discharge 301a and the SOC model at charge 301b is created in advance by collecting the characteristic data of the lead acid storage batttery while discharge and charge are being performed such that the characteristics of the lead acid storage batttery are checked.

A method of creating an SOC model is described, as an example, in detail in "MODELING METHOD FOR LEAD ACID STORAGE BATTTERY SIMULATION USING STEP CHANGING CURRENT" (Publication of Power and Energy Society B, Vol. 128 No. 8, 2008), which also includes a procedure of creating a model.

The SOC estimation model selection unit 302 checks a current state of the lead acid storage batttery, either "at discharge" or "at charge", by checking the current flowing in the lead acid storage batttery through the storage batttery state measurement unit 102. And then, the SOC estimation model selection unit 302 selects either of the SOC model at discharge 301a and the SOC model at charge 301b in accordance with the current state, the selected one being suitable for the estimation of an SOC.

The SOC estimation unit 303 estimates an SOC of the lead acid storage batttery by using the selected one of the SOC model at discharge 301a and the SOC model at charge 301b and assumes the estimated SOC to be a temporary SOC. The determined temporary SOC estimation value is divided into an estimation result at discharge 304a and an estimation result at charge 304b to be stored in the temporary SOC estimation result DB 304.

The SOC determination unit 305 determines a current SOC by weighing the temporary SOC estimation result at discharge and the temporary SOC estimation result at charge, which are stored in the temporary SOC estimation result DB 304, based on the information from the SOC model reliability DB 306.

A final SOC can be determined by checking in advance the reliability of the SOC model in which, for example, the reliability of the SOC model at discharge 301a is almost the same as that of the SOC model at charge 301b in a region where an SOC is low while the reliability of the SOC model at discharge 301a is higher than that of "the model at charge" in a range where an SOC is high, and then by weighing the temporary SOC value in accordance with the reliability or the closeness from the time when estimation is desirably performed.

For example, in the case where the lead acid storage batttery is currently being in "a range where an SOC is high" and currently being "charged"; however, the lead acid storage batttery was "discharged" just before and there remains the temporary SOC value at the time, a current SOC can be determined by weighing the temporary SOC estimation result (temporary SOC estimation value divided into "at discharge" and "at charge") based on the information on the reliability and on how away it is from the time when the SOC is desirably to be determined).

The determined SOC is stored in the SOC transition DB 105 followed by the determination of an equalized charge interval and a method thereof with a similar way. Alternatively, it may be made that the information in the SOC model reliability DB 306 is updated and learned, when needed, by providing the learning unit 307.

With the aforementioned configuration, an equalized charge interval and a method thereof can be determined based on the SOC model at discharge 301a, the SOC estimation model at charge 301b, and the "reliability", while an SOC is being estimated accurately.

[System Processing Flow]

Figure 13:
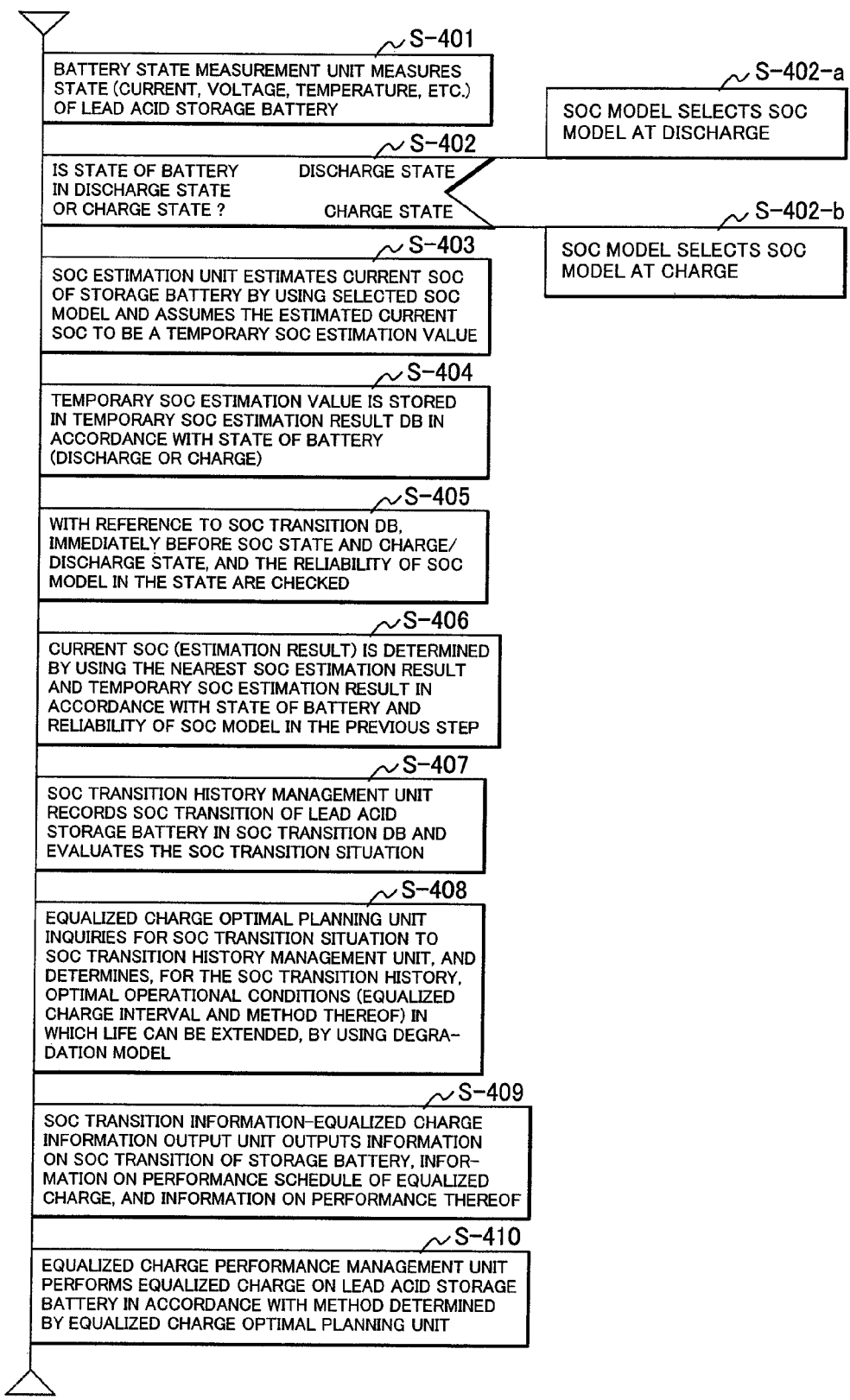
FIG. 13 is a processing flow diagram according to the second embodiment of the invention.

Subsequently, the processing flow according to the second embodiment will be described briefly with reference to FIG. 13. The storage batttery state measurement unit measures a state (current, voltage, temperature, etc.) of the lead acid storage batttery (S401). It is checked whether a state of the storage batttery is in a discharge state or a charge state (S402), and when in a discharge state, the SOC model selects the SOC model at discharge (S402a). When in a charge state, the SOC model selects the SOC model at charge (S402b). The SOC estimation unit estimates a current SOC of the lead acid storage batttery by using the selected SOC model and assumes the estimated current SOC to be a temporary SOC estimation value (S403). The temporary SOC estimation value is stored in the temporary SOC estimation result DB in accordance with a state of the storage batttery (discharge or charge) (S404). With reference to the SOC transition DB, the immediately before SOC state and charge/discharge state, and the reliability of the SOC model in the state are checked (S405). A current SOC (estimation result) is determined by using the nearest SOC estimation result and the temporary SOC estimation result in accordance with the state of the storage batttery and the reliability of the SOC model in the previous step (S406).

The SOC transition history management unit records an SOC transition of the lead acid storage batttery in the SOC transition DB and evaluates the SOC transition situation (S407). The equalized charge optimal planning unit inquiries for the SOC transition situation to the SOC transition history management unit, and determines, for the SOC transition history, the optimal operational conditions (equalized charge interval and method thereof) in which the life of the lead acid storage batttery can be extended, by using the degradation model (S408). The SOC transition information-equalized charge information output unit outputs the information on the SOC transition of the lead acid storage batttery, the information on the performance schedule of the equalized charge, and the information on the performance thereof (S409). The equalized charge performance unit performs equalized charge on the lead acid storage batttery in accordance with the method determined by the equalized charge optimal planning unit (S410). With the aforementioned processing, optimal equalized charge can be performed in accordance with a status of use (SOC transition situation) of the lead acid storage batttery, in which the life of the lead acid storage batttery can be extended.

Third Embodiment

Subsequently, a method by which the life of the lead acid storage batttery can be extended will be described as a third embodiment of the present invention with reference to FIGS. 14 and 15, in which, when a predicted value of the wind power generation, as natural energy, can be obtained, a charge/discharge plan and a charge/discharge target by which the life of the lead acid storage batttery can be extended are set by using an SOC transition history and a degradation model.

Figure 14:
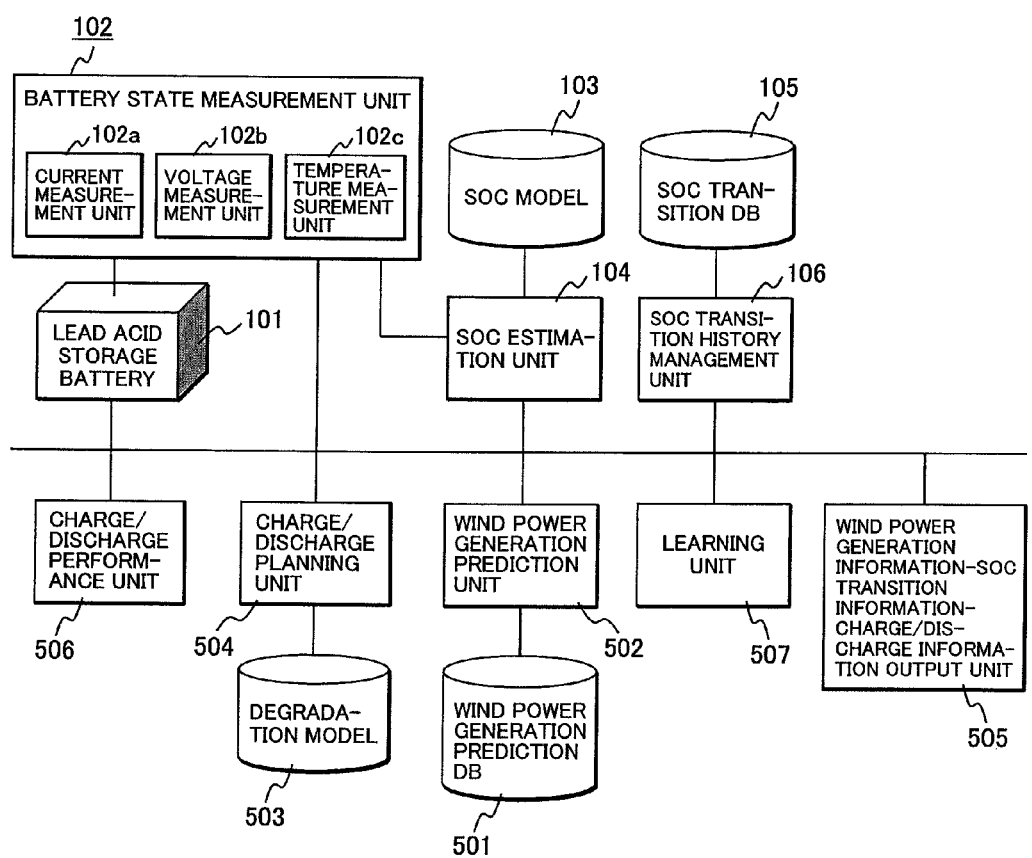
FIG. 14 is a functional block diagram according to a third embodiment.
Figure 15:
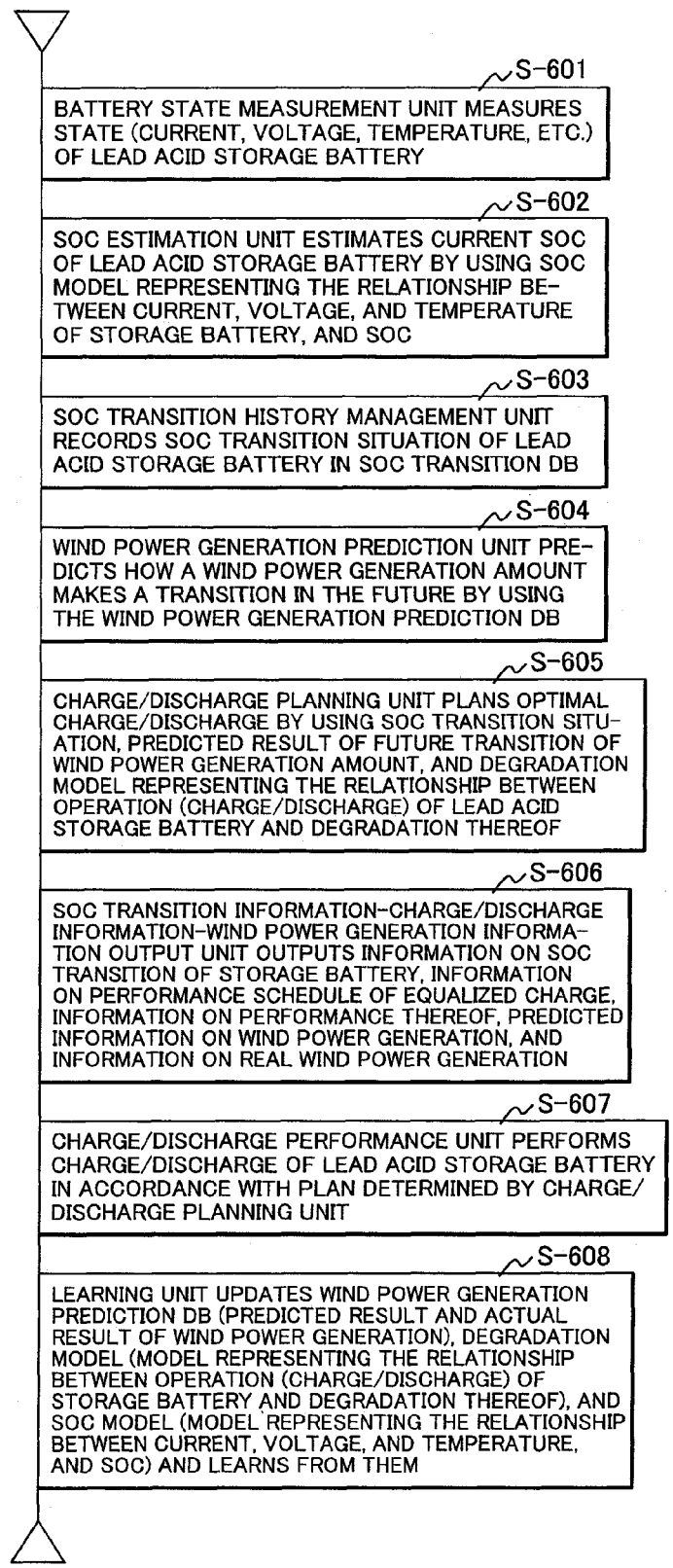
FIG. 15 is a processing flow diagram according to the third embodiment of the invention.

FIG. 14 illustrates a functional block according to the third embodiment of the present invention. The functional block is composed of a lead acid storage batttery 101, a storage batttery state measurement unit 102, an SOC model 103, an SOC estimation unit 104, an SOC transition DB 105, an SOC transition history management unit 106, an wind power generation prediction DB 501, an wind power generation prediction unit 502, a degradation model 503, a charge/discharge planning unit 504, an wind power generation information-SOC transition information-charge/discharge information output unit 505, a charge/discharge performance unit 506, and a learning unit 507.

The third embodiment is characterized by the fact that the charge/discharge planning unit 504 plans charge/discharge of the lead acid storage batttery by obtaining predicted values of the future wind power generation from the wind power generation prediction DB 501 and the wind power generation prediction unit 502 and by taking into consideration the situation of the lead acid storage batttery at the time, SOC transition situation thereof, and knowledge (degradation model 503) regarding operation and degradation thereof.

[System Processing Flow]

Subsequently, the processing flow will be described with reference to FIG. 15. The storage batttery state measurement unit first measures a state (current, voltage, temperature, etc.) of the lead acid storage batttery (S601). Subsequently, the SOC estimation unit estimates a current SOC of the lead acid storage batttery by using an SOC model representing the relationship between the current, voltage and temperature of the lead acid storage batttery, and an SOC (S602).

Then, the SOC transition history management unit records an SOC transition of the lead acid storage batttery in the SOC transition DB (S603).

The wind power generation prediction unit predicts how a wind power generation amount makes a transition in the future by using the wind power generation prediction DB (S604).

The charge/discharge planning unit plans optimal charge/discharge by using the SOC transition situation, the predicted result of the future transition of a wind power generation amount, and a degradation model representing the relationship between an operation (charge/discharge) of the lead acid storage batttery and the degradation thereof (S605).

The SOC transition information-charge/discharge information-wind power generation information output unit outputs the predicted information on the wind power generation, the information on the SOC transition of the lead acid storage batttery, and the information on the charge/discharge thereof (S606). The charge/discharge performance unit performs charge/discharge of the lead acid storage batttery in accordance with the plan determined by the charge/discharge planning unit (S607).

In addition, the learning unit updates the wind power generation prediction DB (predicted result and actual result of the wind power generation), the degradation model (relation between operation (charge/discharge) of the lead acid storage batttery and degradation thereof), and the SOC model (model representing the relationship between current, voltage, and temperature, and SOC) and learns from them (S608).

With the aforementioned processing, a method by which the life of the lead acid storage batttery can be extended can be performed, in which, when a predicted value of the wind power generation, as natural energy, can be obtained, a charge/discharge plan and a charge/discharge target by which the life of the lead acid storage batttery can be extended are set by using an SOC transition history and a degradation model.

[Output Examples]

FIGS. 16A and 16B illustrate output examples of a charge/discharge plan. For example, it is assumed that the wind is expected to be drastically weakened xx hours later from now such that the output thereof is drastically decreased, and in order to cover that, the lead acid storage batttery is expected to be demanded for much discharge. Then, the charge/discharge planning unit 504 can make a plan in which a charge/discharge target value is set to be high within the SOC use range to prepare for large discharge. It can be expected that the life of the lead acid storage batttery can be further extended by planning an operation in which the life of the lead acid storage batttery can be extended while the future situation of the lead acid storage batttery is also being predicted, as stated above.

Figure 17A:
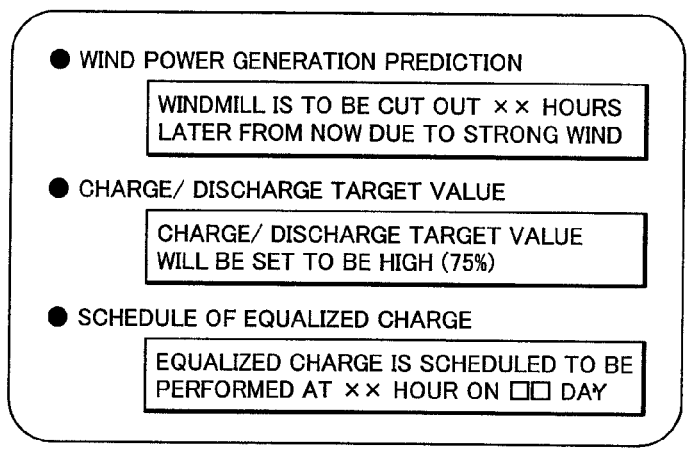
FIG. 17A is an illustrative diagram of an output of an SOC transition situation and an equalized charge notice according to the third embodiment of the invention.
Figure 17B:
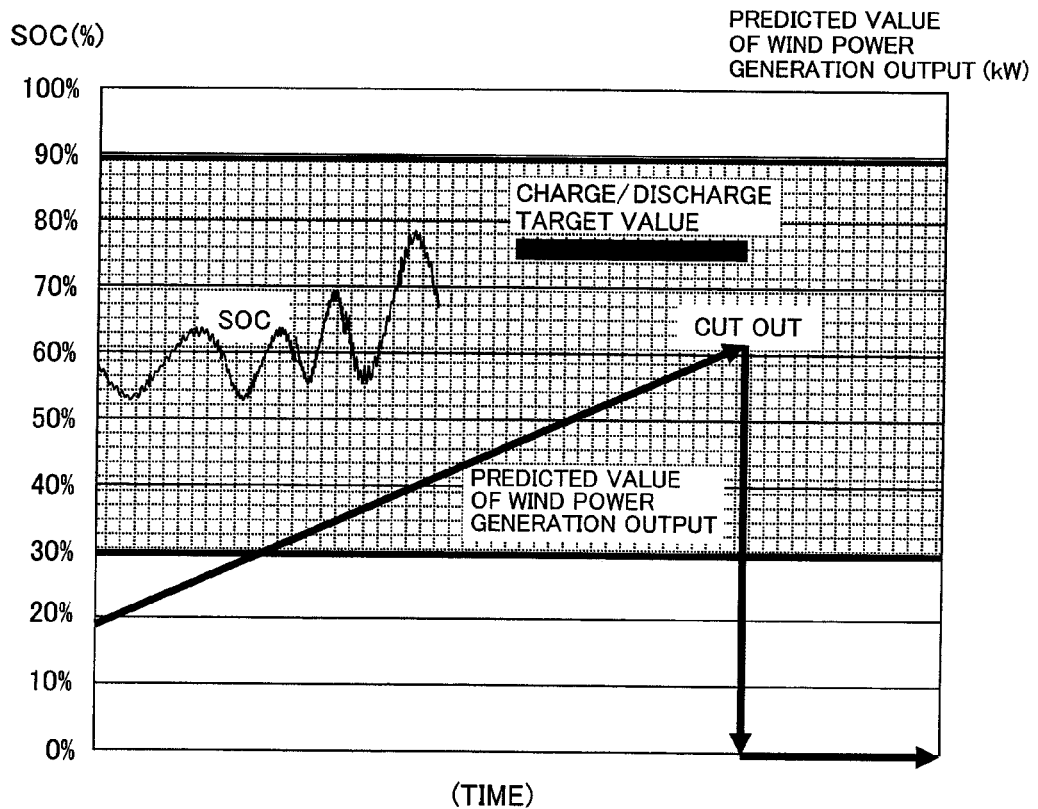
FIG. 17B is an illustrative diagram of an output of the SOC transition situation and the equalized charge notice according to the third embodiment of the invention.

FIGS. 17A and 17B illustrate output examples (output of the wind power generation information-SOC transition information-charge/discharge information output unit 505) according to the present embodiment. Bedsides an SOC transition situation (graph), the predicted information on the wind power generation, a charge/discharge target value, and a performance schedule of the equalized charge, etc., are displayed on the output screen. In this example, the wind power generation is predicted such that "the windmill is to be cut out xx hours later from now due to strong wind". When the windmill is cut out, the output of the windmill is decreased to zero from the "maximum", and hence there are increased demands for discharge to the lead acid storage batttery. Accordingly, in this example, the sentence of "a charge/discharge target value will be set to be high (SOC 75%) within the SOC use range" is displayed. People who operate the lead acid storage batttery can utilize the lead acid storage batttery systematically by outputting a predicted result of the wind power generation and a charge/discharge target, etc., in this way. It also becomes possible for users controlling the lead acid storage batttery to easily operate and control the lead acid storage batttery by a notice of a timing when the equalized charge is performed.

Figure 18:
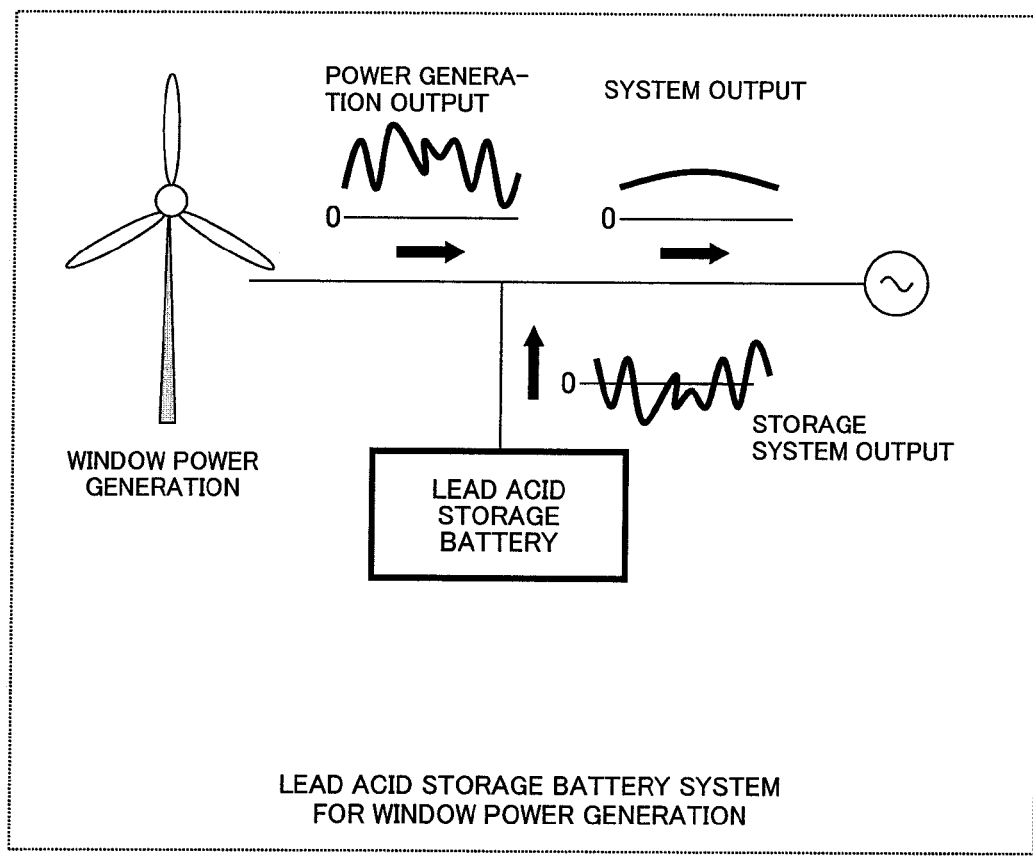
FIG. 18 is a schematic diagram illustrating a lead acid storage batttery system for wind power generation to which the invention is applied.

FIG. 18 illustrates the system configuration when the present invention is applied to a wind power generation system. In FIG. 18, a power generation output of the wind power generation is equalized by the power storage system output of the lead acid storage batttery or lead acid storage batttery system and supplied to the system as an stabilized system output. In the wind power generation system, the life of the lead acid storage batttery or lead acid storage batttery system according to the present invention can be extended by being operated at proper frequencies based on the information on an SOC transition, thereby greatly contributing to an efficient operation of the whole natural energy system.

Explanation of References
- 101 LEAD ACID STORAGE BATTTERY
- 102 STORAGE BATTTERY STATE MEASUREMENT UNIT
- 103 SOC MODEL
- 110 EQUALIZED CHARGE PERFORMANCE UNIT
- 104 SOC ESTIMATION UNIT
- 105 SOC TRANSITION DB
- 106 SOC TRANSITION HISTORY MANAGEMENT UNIT
- 107 DEGRADATION MODEL
- 108 EQUALIZED CHARGE OPTIMAL PLANNING UNIT
- 108a EQUALIZED CHARGE INTERVAL DETERMINATION UNIT
- 108b EQUALIZED CHARGE METHOD DETERMINATION UNIT
- 109 SOC TRANSITION INFORMATION-EQUALIZED CHARGE INFORMATION OUTPUT UNIT
- 301a SOC MODEL AT DISCHARGE
- 301b SOC MODEL AT CHARGE
- 302 SOC ESTIMATION MODEL SELECTION UNIT
- 304 TEMPORARY SOC ESTIMATION RESULT DB
- 306 SOC MODEL RELIABILITY DB
- 506 CHARGE/DISCHARGE PERFORMANCE UNIT
- 501 WIND POWER GENERATION PREDICTION DB
- 502 WIND POWER GENERATION PREDICTION UNIT
- 504 CHARGE/DISCHARGE PLANNING UNIT
- 505 WIND POWER GENERATION INFORMATION-SOC TRANSITION INFORMATION-CHARGE/DISCHARGE INFORMATION OUTPUT UNIT

The invention claimed is:

1. A lead acid storage battery to be used in a natural energy utilization system, including: a storage battery state measurement unit for measuring a state of the lead acid storage battery; an SOC model representing the relationship between output factors including current, voltage, and temperature of the lead acid storage battery and a state of charge of the lead acid storage battery; and an equalized charge performance unit for performing equalized charge of the lead acid storage battery, the lead acid storage battery comprising:

an SOC estimation unit configured to estimate a state of charge of the lead acid storage battery from the information measured by the storage battery state measurement unit and the information from the SOC model;

an SOC transition database configured to record how a state of charge of the lead acid storage battery makes a transition;

an SOC transition history management unit configured to record, in the SOC transition database, a value of state of charge estimated by the SOC estimation unit and to check an SOC transition situation;

a degradation model representing the relationship between an operation situation of the lead acid storage battery including a state of charge of the lead acid storage battery and degradation; and an equalized charge optimal planning unit configured to plan an interval of performing the equalized charge based on the information on a center of the SOC transition from the SOC transition history management unit and the information from the degradation model.

2. The lead acid storage battery to be used in a natural energy utilization system according to claim 1, wherein the equalized charge optimal planning unit further comprise an equalized charge interval determination unit and an equalized charge method determination unit.

3. The lead acid storage battery to be used in a natural energy utilization system according to claim 1 or claim 2, wherein the SOC model comprises a selected one of a SOC model at discharge and a selected one of the SOC model at charge, and an SOC estimation model selection unit configured to select one of the SOC model at discharge and the SOC model at charge based on the information from the storage battery state measurement unit.

4. The lead acid storage battery to be used in a natural energy utilization system according to claim 1 or claim 2 further comprising:

a temporary SOC estimation result database; and
a SOC model reliability database, wherein the SOC estimation unit estimates a temporary SOC, which is an SOC of the lead acid storage battery, by using the selected one of the SOC model at discharge and the SOC model at charge, and divides the estimated temporary SOC into an estimation result at discharge and an estimation result at charge to store in the temporary SOC estimation result database, and the SOC estimation unit estimates a current SOC based on the estimation result at discharge, the estimation result at charge, and the information from the SOC model reliability database.

5. The lead acid storage battery to be used in a natural energy utilization system according to claim 1 or claim 2, wherein an equalized charge interval determined by the equalized charge optimal planning unit is based on any one of a discharge amount (Ah), a charge/discharge amount (Ah), a discharge period of time, and discharge days of the lead acid storage battery.

6. The lead acid storage battery to be used in a natural energy utilization system according to claim 1 or claim 2 comprising:

an SOC transition information-equalized charge information output unit configured to output the information on the SOC transition situation stored in the SOC transition database and the information on a performance schedule of the equalized charge determined by the equalized charge optimal planning unit.

7. The lead acid storage battery to be used in a natural energy utilization system according to claim 6, wherein the SOC transition information-equalized charge information output unit outputs the information on a discharge amount (Ah) or a charge or discharge amount (Ah) of the lead acid storage battery, in addition to the information on the SOC transition situation and the information on the performance schedule of the equalized charge.

8. A lead acid storage battery to be used in a natural energy utilization system, including: a storage battery state measurement unit for measuring a state of the lead acid storage battery; an SOC model representing the relationship between output factors including current, voltage, and temperature of the lead acid storage battery and a state of charge of the lead acid storage battery; and a charge/discharge performance unit for performing equalized charge of the lead acid storage battery, the lead acid storage battery comprising:
- an SOC estimation unit configured to estimate a state of charge of the lead acid storage battery from the information measured by the storage battery state measurement unit and the information from the SOC model;
- an SOC transition database configured to record an SOC transition situation of the lead acid storage battery;
- an SOC transition history management unit configured to record, in the SOC transition database, a value of SOC estimated by the SOC estimation unit and to check an SOC transition situation;
- a wind power generation prediction database created by analyzing the wind power generation information in the past to obtain a predictive value of the wind power generation;
- a wind power generation prediction unit configured to predict a wind power generation amount in the future by using the wind power generation prediction database;
- a degradation model representing the relationship between an operation situation of the lead acid storage battery including an SOC of the lead acid storage battery and charge/discharge of the storage battery, and degradation;
- a charge or discharge planning unit configured to plan an interval of charge or discharge of the lead acid storage battery optimal for the extension of the life of the lead acid storage battery, based on the information on the prediction result of the wind power generation in the future from the wind power generation prediction unit, the information on the center of the SOC transition from the SOC transition history management unit, and the information from the degradation model; and
- a charge/discharge performance unit configured to control charge and discharge of lead acid storage battery in accordance with the charge/discharge plan determined by the charge/discharge planning unit.

9. The lead acid storage battery to be used in a natural energy utilization system according to claim 8 comprising:
- a wind power generation information-SOC transition information-charge/discharge information output unit configured to output the information on the prediction result of the wind power generation by the wind power generation prediction unit, the information on the SOC transition situation stored in the SOC transition database, and the information on the charge/discharge determined by the charge/discharge planning unit.

10. A lead acid storage battery system to be used in a natural energy utilization system, including: a lead acid storage battery; a storage battery state measurement unit for measuring a state of the lead acid storage battery; an SOC model representing the relationship between factors of the lead acid storage battery, such as current, voltage, and temperature, etc., and a storage battery charge of state of the lead acid storage battery; and an equalized charge performance unit for performing equalized charge of the lead acid storage battery, the lead acid storage battery system comprising:
- an SOC estimation unit configured to estimate a state of charge of the lead acid storage battery from the information measured by the storage battery state measurement unit and the information from the SOC model;
- an SOC transition database configured to record how a state of charge of the lead acid storage battery make a transition;
- an SOC transition history management unit configured to record, in the SOC transition database, a value of state of charge estimated by the SOC estimation unit and to check an SOC transition situation;
- a degradation model representing an operation situation of the lead acid storage battery including a state of charge of the lead acid storage battery, and degradation; and
- an equalized charge optimal planning unit configured to plan an interval of performing the equalized charge based on the information on a center of the SOC transition from the SOC transition history management unit and the information from the degradation model.

11. The lead acid storage battery system to be used in a natural energy utilization system according to claim 10, wherein
the equalized charge optimal planning unit further comprises an equalized charge interval determination unit and an equalized charge method determination unit.

12. The lead acid storage battery system to be used in a natural energy utilization system according to claim 10 or claim 11, wherein
the SOC model comprises an SOC model at discharge, an SOC model at charge, and an SOC estimation model selection unit configured to select one of the SOC model at discharge and the SOC model at charge based on the information from the storage battery state measurement unit.

13. The lead acid storage battery system to be used in a natural energy utilization system according to claim 10 or claim 11 comprising:
a temporary SOC estimation result database; and
an SOC model reliability database, wherein
the SOC estimation unit estimates a temporary SOC, which is an SOC of the lead acid storage battery, by using the selected one of the SOC model at discharge and the SOC model at charge, and separates the estimated temporary SOC into an estimation result at discharge and an estimation result at charge to store in the temporary SOC estimation result database, and the SOC estimation unit estimates a current SOC based on the estimation result at discharge, the estimation result at charge, and the information from the SOC model reliability database.

14. The lead acid storage battery system to be used in a natural energy utilization system according to claim 10 or claim 11, wherein
an equalized charge interval determined by the equalized charge optimal planning unit is based on any one of a discharge amount (Ah), a charge/discharge amount (Ah), a discharge period of time, and discharge days of the lead acid storage battery.

15. The lead acid storage battery system to be used in a natural energy utilization system according to claim 10 or claim 11 comprising:
an SOC transition information-equalized charge information output unit configured to output the information on the SOC transition situation stored in the SOC transition database and the information on a performance schedule of the equalized charge determined by the equalized charge optimal planning unit.

16. The lead acid storage battery system to be used in a natural energy utilization system according to claim 15, wherein the SOC transition information-equalized charge information output unit outputs the information on a discharge amount (Ah) or a charge/discharge amount (Ah) of the lead acid storage battery, in addition to the information on the SOC transition situation and the information on the performance schedule of the equalized charge.

17. A lead acid storage battery system to be used in a natural energy utilization system, including: a storage battery state measurement unit for measuring a state of the lead acid storage battery; an SOC model representing the relationship between output factors including current, voltage, and temperature of the lead acid storage battery and a state of charge of the lead acid storage battery; and a charge/discharge performance unit for performing equalized charge of the lead acid storage battery, the lead acid storage battery system comprising:

an SOC estimation unit configured to estimate a state of charge of the lead acid storage battery from the information measured by the storage battery state measurement unit and the information from the SOC model;

an SOC transition database configured to record an SOC transition situation of the lead acid storage battery;

an SOC transition history management unit configured to record, in the SOC transition database, a value of SOC estimated by the SOC estimation unit and to check an SOC transition situation;

a wind power generation prediction database created by analyzing the wind power generation information in the past to obtain a predictive value of the wind power generation;

a wind power generation prediction unit configured to predict a wind power generation amount in the future by using the wind power generation prediction database;

a degradation model representing the relationship between an operation situation of the lead acid storage battery including an SOC of the lead acid storage battery and charge/discharge of the storage battery, and degradation;

a charge/discharge planning unit configured to plan an interval of charge/discharge of the lead acid storage battery optimal for the extension of the life of the lead acid storage battery, based on the information on the prediction result of the wind power generation in the future from the wind power generation prediction unit, the information on the center of the SOC transition from the SOC transition history management unit, and the information from the degradation model; and a charge/discharge performance unit configured to control charge/discharge of the lead acid storage battery in accordance with the charge/discharge plan determined by the charge/discharge planning unit.

18. The lead acid storage battery system to be used in a natural energy utilization system according to claim 17 comprising:

a wind power generation information-SOC transition information-charge/discharge information output unit configured to output the information on the prediction result of the wind power generation by the wind power generation prediction unit, the information on the SOC transition situation stored in the SOC transition database, and the information on the charge/discharge determined by the charge/discharge planning unit.

* * * * *